United States Patent [19]

So

[11] Patent Number: 5,225,784

[45] Date of Patent: Jul. 6, 1993

[54] DC CURRENT COMPARATOR CIRCUIT FOR GENERATING AN ADJUSTABLE OUTPUT PROPORTIONAL TO AN INPUT SIGNAL

[75] Inventor: Eddy So, Glucester, Canada

[73] Assignee: National Research Council of Canada, Ontario, Canada

[21] Appl. No.: 802,194

[22] Filed: Dec. 4, 1991

Related U.S. Application Data

[63] Continuation-in-part of Ser. No. 659,692, Feb. 25, 1991, abandoned.

[51] Int. Cl.$^5$ .................. G01R 27/00; H03M 1/66
[52] U.S. Cl. .................. 324/657; 341/149; 324/725
[58] Field of Search .......... 324/725, 654, 657; 341/144, 149; 323/249, 252, 357, 356

[56] References Cited

U.S. PATENT DOCUMENTS

| | | | |
|---|---|---|---|
| 3,490,038 | 1/1970 | Kusters et al. | 324/725 |
| 3,688,301 | 8/1972 | Suzuki | 341/149 |
| 3,825,925 | 7/1974 | Brusch | 341/149 |
| 4,477,772 | 10/1984 | So | 324/654 |
| 4,528,498 | 7/1985 | So | 324/657 |
| 4,638,302 | 1/1987 | So et al. | 341/149 |
| 5,113,140 | 5/1992 | So | 324/680 |

FOREIGN PATENT DOCUMENTS

| | | | |
|---|---|---|---|
| 0230292 | 3/1969 | U.S.S.R. | 324/725 |
| 0508746 | 5/1976 | U.S.S.R. | 324/725 |
| 0553542 | 4/1977 | U.S.S.R. | 324/725 |
| 1575122 | 6/1990 | U.S.S.R. | 324/725 |
| 1575123 | 6/1990 | U.S.S.R. | 324/725 |
| 1204894 | 9/1970 | United Kingdom | 324/657 |

Primary Examiner—Jack B. Harvey
Assistant Examiner—Maura K. Regan

[57] ABSTRACT

A DC current-comparator-based circuit generates an adjustable output proportional to an input signal, i.e. an input voltage or current. One use of the circuit is in the formation of a DC resistance bridge that can be controlled automatically by a microprocessor. The ends of a pair of test resistors (the resistances of which are to be compared) are connected to respective ratio windings of the current comparator. The same potential is applied across these resistors by a master power supply. A microprocessor is alternately supplied with two voltage signals, a first being proportional to the current in a variable one of the ratio windings of the comparator, and the second being proportional to any inequality between the current in the other ratio winding and the test resistor to which it is connected. The microprocessor controls a slave power supply that receives both the first signal and a third signal that is indicative of any unbalance in the bridge. Balance is achieved by adjusting the variable ratio winding. Another use of the basic circuit is in the formation of an improved digital-to-analog converter, in which case the digital input controls the number of turns on the variable winding and the third signal provides the equivalent analog output.

21 Claims, 5 Drawing Sheets

DC CURRENT COMPARATOR CIRCUIT FOR GENERATING AN ADJUSTABLE OUTPUT PROPORTIONAL TO AN INPUT SIGNAL

RELATED APPLICATION

This application is a continuation-in-part of application Serial No. 07/659,692 filed Feb. 25, 1991, now abandoned.

FIELD OF THE INVENTION

This invention relates to a DC current comparator circuit for generating an adjustable output proportional to an input signal, e.g. an input voltage or current.

In one aspect, the invention can take the form of a circuit that can be employed for resistance measurement in a current-comparator-based DC resistance bridge. In this case the input signal to the circuit can be a current through an unknown resistor, the resistance of which is to be measured, while the output becomes a value, i.e. the value of such resistance expressed as a ratio to a known resistance.

In another aspect, the invention can take the form of a circuit that is employed as part of an improved digital to analog converter, hereinafter referred to as a DAC. In this case the input signal to the circuit can be a current or voltage, while the output is a DC analog signal (voltage or current) that is accurately proportional to a digital input and the input current or voltage.

PRIOR ART

In relation to the application of the present invention to use in a DC resistance bridge, it is convenient to refer initially to a publication of N.L. Kusters et al, "A Direct Current Comparator Bridge for High Resistance Measurements" that was published in IEEE Transactions and Measurement, Vol. 1M-22, No. 4, December 1973, pp. 382-386, and disclosed the use of a DC comparator as part of a bridge capable of measuring resistors to an accuracy of approximately one part per million. Similar technology had already been proposed by M. P. MacMartin et al in "A Direct-Current-Comparator Ratio Bridge for Four-Terminal Resistance Measurements" published in IEEE Transactions on Instrumentation and Measurement, Vol. 1M-15, No. 4, December 1966, pp. 212-220; and by N. L. Kusters et al in "Direct-Current Comparator Bridge for Resistance Thermometry" published in IEEE Transactions on Instrumentation and Measurement, Vol. 1M-19, No. 4, November 1970, pp. 291-297. U.S. Pat. Nos. 3,490,038 issued Jan. 13, 1970 and 3,500,171 issued Mar. 10, 1970 to N. L. Kusters et al, and Canadian patent No. 769,229 issued Oct. 10, 1967 to M. P. MacMartin et al also relate to this technology and explain the basic structure and function of a current-comparator-based DC bridge.

FIG. 1 of the present application, which is based on the circuit illustrated in FIG. 1 of the first of the Kusters et al articles referred to above, provides a typical example of the various prior art proposals. A self-balancing DC comparator CC is the central component of the bridge of FIG. 1. It has two cores C1 of high-permeability magnetic material that are driven into saturation twice per cycle by a magnetic modulator MM. When DC flows through a variable ratio winding $N_X$, the signal at the input to a peak detector PD contains even harmonics of the modulation frequency. This signal is converted to DC by the peak detector PD and is amplified in a slave power supply SS, causing a current to flow through a second ratio winding $N_S$ with a fixed number of turns, to reduce the net combined ampere turns in the ratio windings. This self-balancing comparator thus performs like a current transformer that operates down to zero frequency, i.e., DC.

The test resistors to be compared $R_X$ (unknown) and $R_S$ (standard), are connected so that current from a master power supply MS flows through the adjustable number of turns of the winding $N_X$ and through the resistor $R_X$. Current from the slave power supply SS flows through the ratio winding $N_S$ and through the resistor $R_S$. At balance, the ratio of the current in each side of the circuit is related to the inverse of the ratio of the number of turns in the corresponding winding, and is indicated by a null at an ampere-turn balance meter BM. Also, the ratio of the currents is related to the inverse of the ratio of the corresponding resistors, as indicated by a null at a galvanometer GA. The bridge is thus a double-balance bridge, the resistance ratio at balance being the same as the turns ratio, i.e., $R_X = =R_S(N_X/N_S)$ For convenience the reference letters $N_X$ and $N_S$ that identify the windings are also used in the equations to indicate the number of turns in such windings.

The ampere-turn balance is achieved, as follows. The closed loop control, consisting of the magnetic modulator MM and the peak detector PD, measures the ampere-turn unbalance and applies a signal to the slave supply SS to reduce the unbalance. A tracking circuit, which includes a high impedance amplifier A, makes the output voltage of the slave supply SS follow that of the master supply MS, to keep the net ampere turns on the $N_S$ side very nearly equal to those on the $N_X$ side. This reduces the range required of the closed loop control so that its error is nearly zero. The manner in which the tracking signal generator can be ganged with the slider on the winding $N_X$ is illustrated by way of example in an expanded version of this basic circuit illustrated in FIG. 2 of the second of the Kusters et al articles referred to above.

In relation to the application of the present invention to use in a DAC, the nearest prior art to applicant's knowledge is his own U.S. Pat. No. 4,638,302 issued Jan. 20, 1987.

SUMMARY OF THE INVENTION

In its broad aspect, the present invention consists of a new DC current comparator circuit comprising a current comparator having a pair of ratio windings, one of which windings has a variable number of turns, and means for generating a first signal proportional to an ampere-turn unbalance between said windings; means for connecting a first end of a resistor to a first end of the variable winding; master power supply means for applying a potential to the second end of said resistor; means for generating a second signal proportional to the current in the variable winding; and slave means having input means connected to receive said first and second signals and output means connected to one end of the other of said windings for supplying a current to such other windings.

Means are connected to the other end of said other winding for generating a third signal that is functionally related to the number of turns on the variable winding and the current in the variable winding. When the circuit is employed as part of a bridge, this functional relationship is such that the third signal is proportional to the change to the number of turns on the variable winding needed to bring the bridge to balance. Thus, when this new circuit is employed as part of a DC bridge for comparing the resistances of a pair of test resistors, it represents an improvement over prior circuits of this type in that it is more readily adapted to the modern demands of automation.

It is thus an object of the present invention to provide an improved current-comparator-based DC resistance bridge that can readily be automated for microprocessor control.

The invention also includes a combination of such an improved bridge with a control circuit for achieving such automation.

In addition, the preferred embodiments of resistance bridge according to the invention that are described below include the following further advantageous features:

(a) a very sensitive galvanometer with a very high input impedance is not required; and
(b) very high resolution can be obtained without the need for a very large number of turns on the adjustable ratio winding. Although the number of turns cannot be varied by a fraction of a turn, and ten thousand turns is about the structural limit for an adjustable ratio winding, a resolution far greater than one part per ten thousand is achievable. In fact, a resolution of the order of one part in $10^8$ can be achieved.

When the new circuit is employed as part of a DAC, the functional relationship of the third signal is that it is proportional to the total number of turns on the variable winding (which number has been set by a digital input) and the current in the variable winding and hence provides the desired analog output corresponding to said digital input. When so employed, the invention provides improvements over prior circuits of this type in that it is simpler to operate and more flexible in respect of the resistance values that can be chosen for use in the circuit.

It is thus a further object of the present invention to provide an improved DC current-comparator-based DAC that is simpler to construct and operate.

The preferred embodiment of DAC according to the invention that is described below includes the following advantageous features:

(c) in comparison with a prior circuit that required the use of a pair of resistors having an exact, comparatively high resistance ratio to each other, the embodiment permits the adoption of any resistance ratio between the two resistors used;
(d) while the prior circuits have required a third resistor, the resistance value of which needed to be fixed compared to one of the main pair of resistors, the embodiment eliminates the need for a third resistor altogether; and
(e) the embodiment has eliminated a need to adjust yet a fourth resistor that the prior circuits employed in accordance with the number of turns employed from time to time on the variable winding.

DETAILED DESCRIPTION OF THE PREFERRED EMBODIMENTS

Use of the circuit in a bridge

Figure 1:
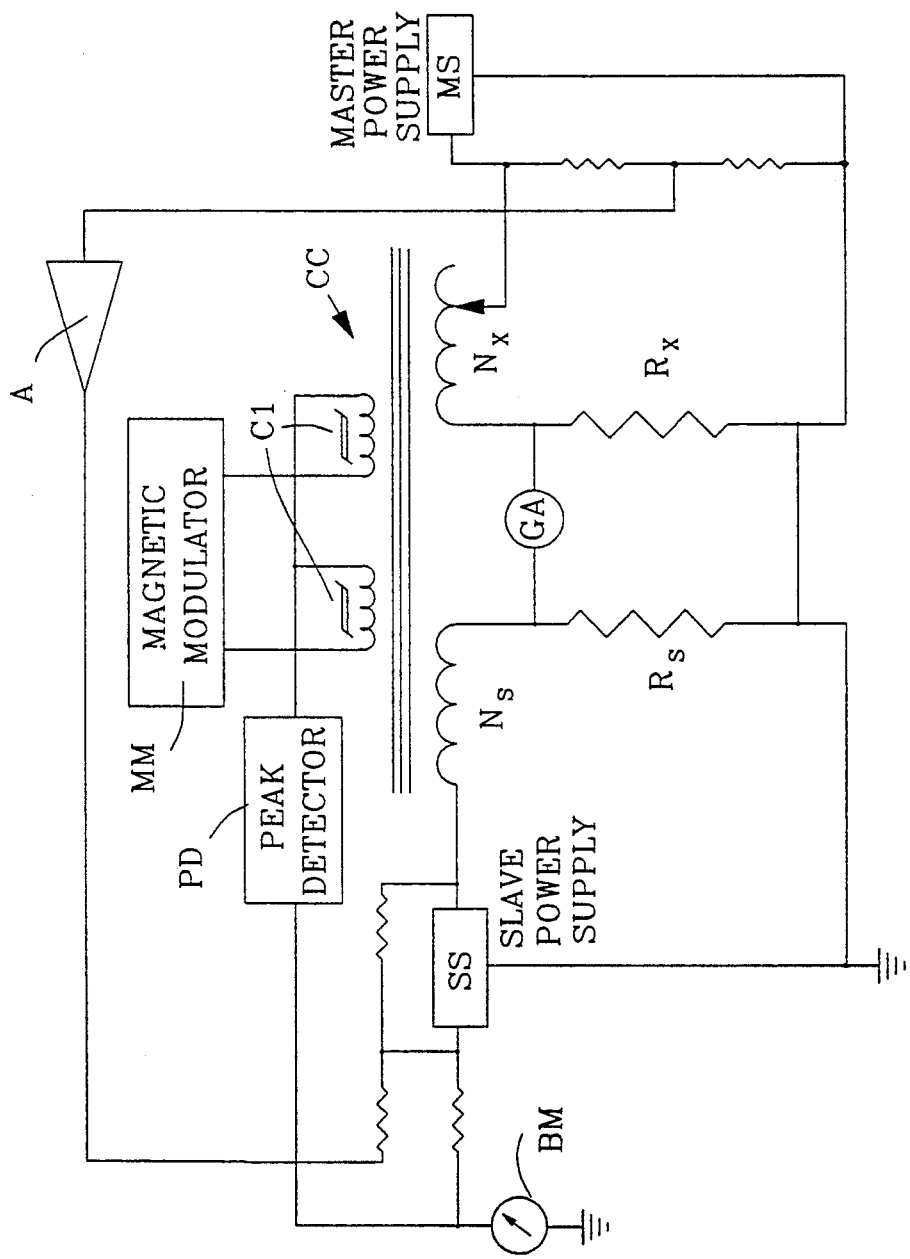
FIG. 1 as already explained, shows a typical prior art resistance bridge circuit.
Figure 2:
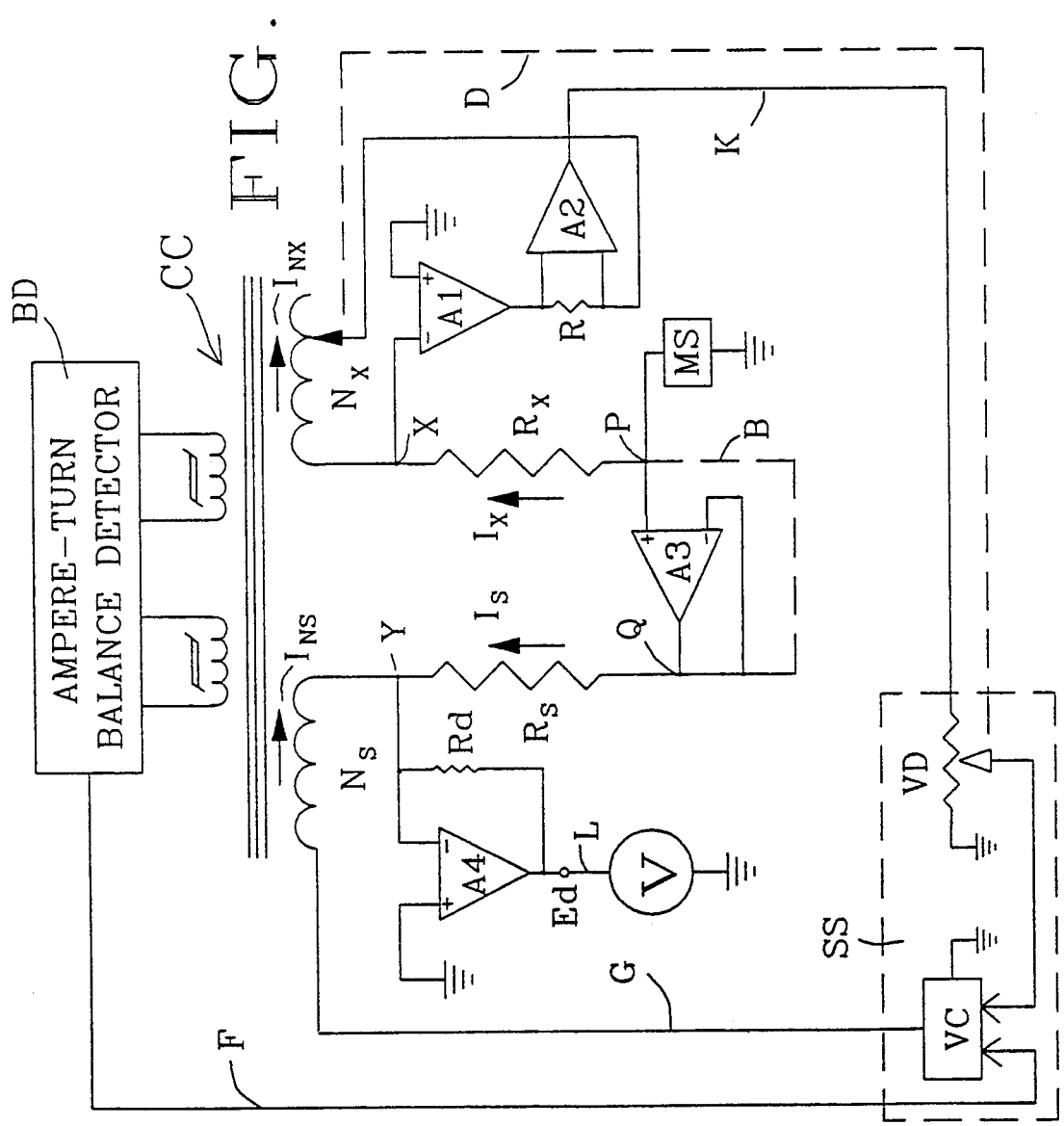
FIG. 2 is a bridge circuit according to an embodiment of the invention.

FIG. 2 shows a current comparator essentially the same as in FIG. 1, except that for simplicity the magnetic modulator and the peak detector are now shown combined into a single, ampere-turn balance detector BD. Also as in FIG. 1, a first end of the standard resistor $R_S$ is connected at point Y to a first end of the ratio winding $N_S$, and a first end of the unknown resistor $R_X$ is connected at point X to a first end of the ratio winding $N_X$. The master power supply MS is connected at point P to the second end of the resistor $R_X$, and, through a unity gain amplifier A3, at point Q to the second end of the resistor $R_S$. This arrangement serves to equalize the voltages of points P and Q, while presenting an almost infinite impedance to the flow of current between these points. Since, as explained more fully below, points Y and X are driven to ground potential by amplifiers A4 and A1, respectively, the result is a 4-terminal measurement circuit. If the resistances of the resistors $R_S$ and $R_X$ are large, a 3-terminal measurement circuit can be achieved by omitting the amplifier A3 and joining the points P and Q together directly, as shown by the broken line B.

The point X between the resistor $R_X$ and the winding $N_X$ is connected to one input of an operational amplifier A1, the other input of which is grounded. The output of the amplifier A1 is connected through a sensing resistor R to the second end of the winding $N_X$ through which a current $I_{NX}$ flows. Thus, the resistor R is in effect in series with the winding $N_X$.

The voltage across the resistor R forms the inputs to a further amplifier A2, the output of which is passed as a voltage signal (subsequently referred to as a "second signal") on line K to a voltage divider VD that is ganged (connection D) to the slider of the variable winding $N_X$. Instead of this mechanical ganging, the controls for these variable devices can be arranged to be adjustable simultaneously by an operator to achieve the same effect. The voltage divider VD feeds a proportional voltage to a voltage-to-current converter VC that also receives an out-of-balance voltage signal (subsequently referred to as a "first signal") on line F from the balance detector BD. The output of the converter VC is proportional to the sum of its input voltages.

There will be seen to be three pieces of information that must be supplied to the slave supply SS that the divider VD and converter VC together constitute. This slave supply must know (a) the value of the current $I_{NX}$ in the winding $N_X$ (it receives this information as the second signal on line K); (b) the number of turns in use on the winding $N_X$ (it receives this information by the connection D); and (c) any unbalance in the comparator, which information it receives as the first signal on line F. The output of the converter VC is connected by line G to the second end of the winding $N_S$.

The point Y between the resistor $R_S$ and the winding $N_S$ is connected to one input of an operational amplifier A4, the other input of which is grounded. The output of the amplifier A4 is connected to an output terminal Ed which is also connected through a resistor Rd to the point Y. A voltmeter V can be connected by a line L between the terminal Ed and ground.

The amplifiers A1 and A4, together with their associated connections, each acts as means for driving the respective points X and Y to ground potential, from which it follows that the voltages across the resistors $R_S$ and $R_X$ must always be equal to each other, since the points P and Q are always at the same potential as each other. This feature is an important practical distinction over the prior art circuit of FIG. 1. In this latter circuit, the voltages across the resistors $R_S$ and $R_X$ become equalized as part of the balancing procedure, i.e. by adjustment of the currents in the resistors $R_S$ and $R_X$ to bring the galvanometer GA to a null reading. In contrast, in the FIG. 2 arrangement of the present invention the circuit connections ensure equality between the voltages across the respective resistors $R_S$ and $R_X$ at all times, while the balancing procedure furnishes a different balance, namely equalization of the currents $I_{NS}$ and $I_X$ in the winding $N_S$ and the resistor $R_X$ respectively.

Another difference between the circuits of FIGS. 1 and 2 is that in FIG. 1 the current in the resistor $R_X$ is supplied by the master power supply MS in series with the winding $N_X$, and the current in the resistor $R_S$ is supplied by the slave power supply SS in series with the winding $N_S$, whereas in FIG. 2 the currents in the resistors $R_S$ and $R_X$ are both supplied by the master supply MS.

More specifically, since the winding $N_X$ is in the feedback of the amplifier A1, the current $I_X$ is equal to $I_{NX}$ and is independent of contact and winding resistances. Since the amplifiers A3, A1 and A4 equalize the voltages across the resistors $R_X$ and $R_S$ in the four-terminal-resistor configuration, $I_X = E/R_X$ and $I_S = E/R_S$, where E is the voltage across these resistors. With the current comparator operating in ampere-turn balance condition, $$I_{NS} = (N_X/N_S).I_{NX} \quad (1)$$

Since $I_{NX} = I_X$, equation (1) can be rewritten as $$I_{NS} = (N_X/N_X).I_X \quad (2)$$

Automatic balance of the net ampere turns is achieved by means of the slave supply SS which is, in effect, an ampere-turn tracking circuit providing the appropriate current $I_{NS}$ in the winding $N_S$. The slave supply SS is driven by the output voltage of the amplifier A2, which is proportional to the current $I_{NX}$, and hence proportional to the current $I_X$ in the resistor $R_X$, and by the output of the ampere-turn balance detector BD. The polarity of the current $I_{NS}$ is such that it is opposite to that of the current $I_S$ in the reference resistor $R_S$. When $I_{NS} = I_S$, the output voltage Ed (subsequently referred to as a "third signal") of the amplifier A4 is zero, indicating a bridge balance. Bridge balance is therefore achieved by adjusting the number of turns in the winding $N_X$ until a null is indicated at the output of the amplifier A4. Since at balance $I_{NS} = I_S$, equation (2) becomes $$I_S = (N_X/N_S).I_X \quad (3)$$

Substituting $I_S = E/R_S$ and $I_X = E/R_X$ in equation (3) gives $$R_X = (N_X/N_S).R_S \quad (4)$$

which is the same relationship as was obtained with the FIG. 1 circuit. The bridge is then direct reading in resistance. If the positions of the resistors $R_X$ and $R_X$ are interchanged so that the resistor $R_S$ is connected between points P and X and the resistor $R_X$ is connected between points Q and Y, then the bridge is direct reading in conductance, as shown in the following equation $$G_X = (N_X/N_S).G_S \quad (4a)$$

Figure 3:
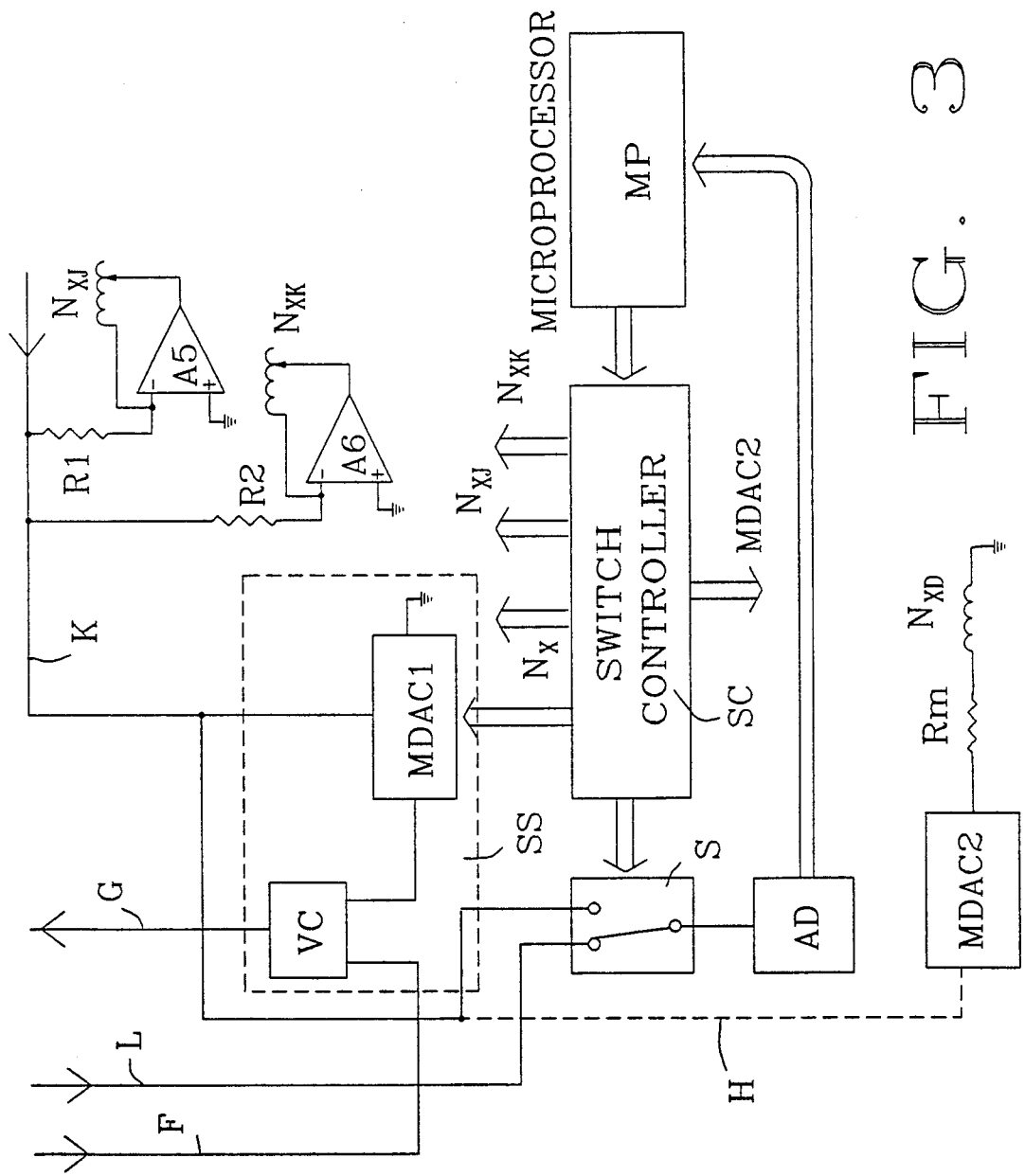
FIG. 3 is a control circuit for use with the bridge circuit of FIG. 2, providing an automated bridge according to a further embodiment of the invention.

The bridge balance can easily be automated using a microprocessor as in FIG. 3 which shows a control circuit that, together with the circuit of FIG. 2, provides a microprocessor-controlled current-comparator-based DC resistance bridge for 4-terminal measurement of resistors.

As indicated above, due to practical limitations, the maximum total number of turns of the ratio windings is about 10,000. A practical example is for the ratio winding $N_X$ to have a 13-bit resolution with adjustable numbers of turns 4096, 2048, 1024, ..., 2, 1, totalling 8191 or $(2^{13}-1)$ turns, with the ratio winding $N_S$ having a fixed number of turns, say 800, providing a turns ratio $(N_X/N_S) = 10.24$. This provides a resistance measuring range of 0 to 10.24 times the resistance of the reference resistor $R_S$. Other ranges and ratios can, of course, be chosen. The total number of turns for the two ratio windings is therefore 8991. The 13-bit resolution (one part in 8192) is, however, insufficient for high accuracy measurements. Since the current comparator is capable of giving turns-ratio accuracies in the order of one part in $10^8$, the resolution of the measurement should also be of the same order. To have a resolution of one part in $10^8$ (26-bit resolution), the primary winding $N_X$ would have to have a total number of turns of $10^8$, which is impossible.

Additional resolution (up to 26 bits or more) can be achieved by deriving fractional currents proportional to $I_X$, through resistors R1 and R2, and driving these currents by means of operational amplifiers A5 and A6 through additional primary ratio windings $N_{XJ}$ and $N_{XK}$, respectively. For R1 = 256.G.R and R2 = 8192.G.R (G is the gain of the amplifier A2 and R is the resistance of the resistor R in series with the winding $N_X$ in the feedback of the amplifier A1), the winding $N_{XJ}$ has the numbers of turns (128, 64, 32, 16, 8, 4, 2, 1), thus providing an additional 8 bits, and the winding $N_{XK}$ has the numbers of turns (16, 8, 4, 2, 1), thus providing the remaining 5 bits, for a total of 26 bits. A resolution of 26 bits can thus be obtained with no significant increase in the total number of adjustable turns of the ratio winding $N_X$. The total number of turns of the ratio windings $N_X$, $N_{XJ}$ and $N_{XK}$ together is only $2^{13} - 1 + 2^8 - 1 + 2^5 - 1 = 8477$.

Figure 4:
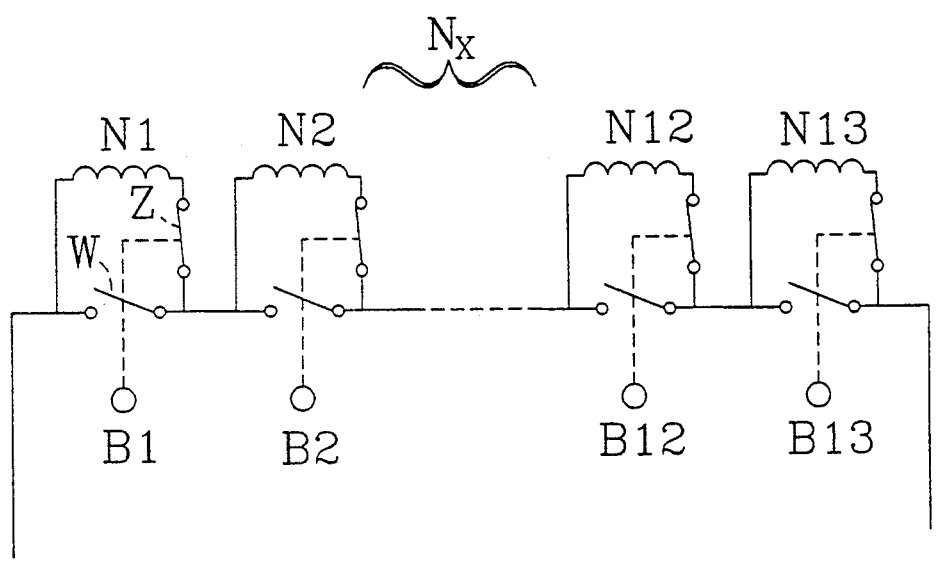
FIG. 4 is a fragment of the combined circuit of FIGS. 2 and 3 in more detail.

FIG. 4 shows the manner in which the winding $N_X$ can be divided into 13 groups N1 ... N13 of turns. Winding group N13 may have 1 turn, for example, with winding group N12 having 2 turns, and winding groups N11 to N1 having respectively 4, 8, 16, 32, 64, 128, 256, 512, 1024, 2048 and 4096 turns. Each bit of the digital input to this arrangement will be applied to a respective terminal B1 ... B13 and will operate a respective relay (not shown) having contacts W and Z. When a contact W is closed its corresponding contact Z is open, and vice versa. In the position shown with all the contacts Z closed and all the contacts W open, all thirteen groups N1 ... N13 are in circuit. When any one of the contacts W is closed, with consequential opening of its associated contact Z, that particular group of turns is taken out of circuit. Windings $N_{XJ}$ and $N_{XK}$ can be similarly divided into 8 and 5 groups, respectively. Further details of this type of arrangement were disclosed in U.S. Pat. No. 4,638,302 issued to E. So, et al Jan. 20, 1987. It should be pointed out, however, that it is not essential to divide the turns into groups based on powers of 2 (binary). The numbers of turns can take another progressive relationship, such as the decimal system.

The slave supply, now identified as SS1, becomes an adjustable current source driven by the output of the amplifier A2 and consisting of a 13-bit (or more) multiplying digital-to-analog converter MDAC1 that divides the voltage it receives from line K and drives the voltage-to-current L converter VC which, as before, receives the out-of-balance signal on line F and outputs the current $I_{NS}$ on line G. This arrangement provides ampere-turn tracking of the first 13-bits (or more) of the primary winding $N_X$ and adjusts the current in the secondary winding $N_S$ to keep the net ampere-turns approximately zero. The closed-loop control (feedback) from the ampere-turn balance detector BD (line F) through the voltage-to-current converter VC tends to keep the net ampere-turn unbalance at zero. The closed-loop gain is sufficiently high to correct for changes in the slave supply circuit due to temperature effects, and also to keep the net ampere-turn unbalance at zero, even through no ampere-turn tracking is provided for the remaining bits of the 26-bit winding $N_X$. For zero net ampere-turns in the ratio windings, the current $I_{NS}$ is proportional to the current $I_X$ in the unknown resistor $R_X$ and to the digital input or the numbers of turns of the windings $N_X$, $N_{XJ}$, and $N_{XK}$. Thus from equation (4)

$$R_X = \left( \sum_{1}^{13} N_X + (1/256) \cdot \sum_{14}^{21} N_{XJ} + (1/8192) \cdot \sum_{22}^{26} N_{XX} \right) \cdot (R_S/N_S) \quad (5)$$

where
$N_X = (2)^{13-i}$ turns for $1 \leq i \leq 13$
$N_{XJ} = (2)^{21-j}$ turns for $14 \leq j \leq 21$
$N_{XK} = (2)^{26-k}$ turns for $22 \leq k \leq 26$.

Alternatively, as shown by broken line H, the additional resolution of 13 bits or more can be obtained by using the output of the amplifier A2 (line K) to drive a 13-bit (or more) multiplying digital-to-analog converter MDAC2. This 13-bit MDAC2 is used to provide adjustable fractional currents, proportional to $I_X$, to a one-turn, auxiliary ratio winding $N_{XD}$ through a resistor Rm that has a resistance value of G.R, where G and R are as defined above, see equation (6) below.

If the additional 13 bits (to obtain 26-bit resolution in the winding $N_X$) are achieved through use of the 13-bit converter MDAC2 to provide adjustable fractional currents (proportional to $I_X$) to the one-turn winding $N_{XD}$ through the resistor Rm with a resistance value of G.R then $$R_X = \sum_{1}^{13} N_X + (1/8192) \cdot \sum_{14}^{26} Dm \cdot N_{XD}) \cdot (R_S/N_S) \quad (6)$$

where Dm is the digital input of the 13-bit MDAC2 and is given by
$Dm = (2)^{26-m}$ for $14 \leq m \leq 26$.

The measurement process starts with the number of turns of the winding $N_X$ set at zero, i.e. $N_X = 0$. From equation (2), $I_{NS} = 0$. Currents $I_S$ and $I_X$ are then measured by the microprocessor MP. A switch S controlled by a switch controller SC alternately connects the outputs of the amplifier A4 (line L) and the amplifier A2 (line K) to an analog-to-digital converter AD. The microprocessor MP then calculates from equation (3) an initial setting for the winding $N_X$ to obtain an approximate balance of the bridge, and instructs the switch controller SC to switch the corresponding number of turns of winding $N_X$ accordingly. The balance condition of the bridge is then checked by measuring the unbalance output voltage on line L, which unbalance is given by $$\Delta Ed = \Delta I_{NS} \cdot Rd \quad (7)$$

Where $\Delta I_{NS}$ is the required additional current in the winding $N_S$ to achieve a bridge balance, and Rd is the resistance of the feedback resistor Rd of the amplifier A4. The additional number of turns in the winding Nx needed to generate $\Delta I_{NS}$ can then be calculated by the microprocessor from equations (2) and (7), and is given by $$\Delta N_X = (N_S/I_X) \cdot (\Delta Ed/Rd) \quad (8)$$

where $\Delta N_X$ is the required additional number of turns in the winding $N_X$ to achieve a bridge balance. $\Delta N_X$ is then added to (or subtracted from) the initial calculated setting of $N_X$ by adjustment of the number of turns on windings $N_X$, $N_{XJ}$ and $N_{XK}$ by the switch controller SC, depending on the magnitude and polarity of the voltage $\Delta Ed$. The process of measuring $\Delta N_X$ is then repeated by measuring $\Delta Ed$ again, until a bridge balance is achieved. The bridge is in balance when the measured voltage $\Delta Ed$ is zero or is less than the voltage change achievable by the least significant bit in the winding $N_{XK}$.

The unknown resistor $R_X$ can be measured without achieving a bridge balance. The bridge can be balanced for the first 12 to 15 bits or more. The remaining unbalance, as indicated by the voltage $\Delta Ed$, is then measured to obtain the value of $\Delta N_X$ required to achieve a balance. This calculated value of $\Delta N_X$ is, however, not used to adjust the previous setting of the number of turns of the winding $N_X$ to achieve balance. Instead, the microprocessor merely calculates the unknown resistor $R_X$ from the previous setting of $N_X$ and the calculated value of $\Delta N_X$. The result is then displayed and/or printed. The accuracy of this measurement depends on the number of bits used for the initial balance. The more bits used for the initial balance, the less stringent is the accuracy requirement for measuring the remaining unbalance signal $\Delta Ed$, and the more accurate the measurement result of the resistor $R_X$.

To summarize the performance of the circuit of FIG. 2, it is to be noted that the third signal, which is the voltage Ed and appears on line L, senses the unbalance in the bridge by virtue of sensing the inequality between the current in the nonvariable winding $N_S$ and the current in the test resistor $R_S$ that is connected to such nonvariable winding. Since the point Y between the nonvariable winding and the test resistor connected to it is at ground potential by virtue of the amplifier A4, any inequality between the desirably equal and opposite currents $I_{NS}$ and $I_S$ must flow from the point Y through the resistor Rd whereby to generate a voltage (third signal) at the terminal Ed. When these equal and opposite currents are truly equal, the third signal will be zero and the unbalance in the bridge will have been eliminated. One way to achieve this balance in the basic circuit of FIG. 2 is to observe the voltmeter V, which is connected between the terminal Ed and ground, and use any reading observed to adjust the number of turns on the variable winding $N_X$.

In the automated embodiment of FIG. 3 this balance is achieved by the microprocessor MP, because the third signal which is received by the voltmeter V in FIG. 2 on line L is communicated via the switch S and the analog-to-digital converter AD to the microprocessor MP which repeatedly samples the third signal on line L and adjusts the number of turns on the windings to reduce this signal (also referred to as ΔEd) to zero.

As explained above, it is not always essential to achieve a bridge balance, because any remaining unbalance, as represented by the voltage ΔEd can be measured and used to calculate an error that is then inserted into the reading of the value of the unknown resistor.

Having regard to the fact that the unbalance in the bridge, as represented by the third signal, can thus be eliminated manually (FIG. 2), or automatically (FIG. 3) or only partially automatically, this third signal is said to enable adjustment of the number of turns of the variable winding to bring the unbalance to null, the term "enable" having been chosen to include the circumstance in which such adjustment is not made automatically (but is left to the operator), or, if made automatically, is not necessarily fully made.

To return to a comparison between FIGS. 1 and 2, it has already been noted that the FIG. 2 circuit produces the same comparison between the test resistors, equation (4), as did the circuit of FIG. 1. But the circuit of FIG. 2 is more suitable for automatic control by a microprocessor for the following reasons:

A. The potential that is indicative of unbalance in the bridge, i.e. the potential Ed, needs to be compared to ground potential for this indication. This comparison is easier to achieve accurately than the comparison between two varying potentials that the galvanometer GA was called upon to make in the FIG. 1 circuit. As a result, this comparison does not require a null detector that is as sensitive as the galvanometer GA and has as high an input impedance as did the galvanometer GA.

B The circuit of FIG. 2 furnishes the microprocessor MP on line K with a voltage signal that is proportional to the current $I_{NX}$ in the variable winding $N_X$ which is equal to the current $I_X$ in the unknown resistor $R_X$. This feature provides a means to automate the bridge more easily. It also provides a means to extend the resolution of the bridge without increasing significantly the number of turns in the $N_X$ winding (using either $N_{XJ}$ plus $N_{XK}$ or MDAC2). The circuit of FIG. 1 provides no equivalent to the signal on line K.

Use of the circuit in a DAC

Figure 5A:
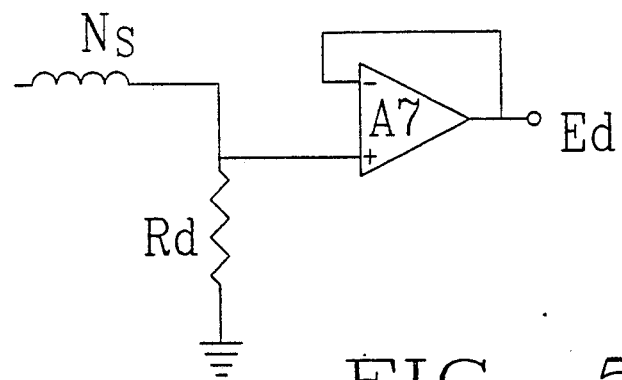
FIG. 5A is a fragmentary view of part of FIG. 5 showing an alternative.
Figure 5:
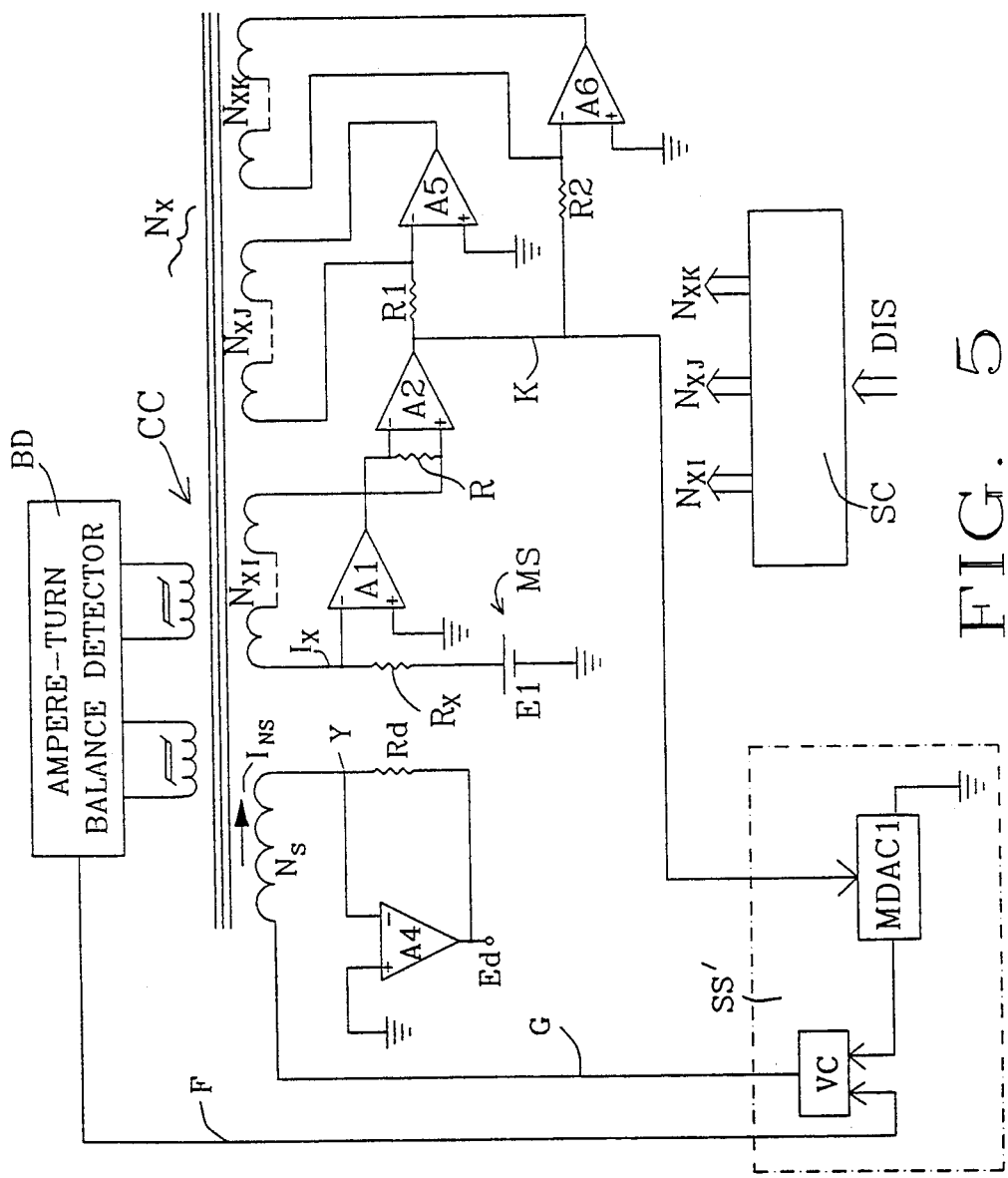
FIG. 5 is a DAC circuit according to a further embodiment of invention.

Turning now to the DAC application of the invention with particular reference to the embodiment of the invention shown in FIG. 5, the DC current comparator CC is employed as before to generation a first signal on line F by means of the ampere-turn balance detector BD, such signal being supplied as one input to the voltage-to-current converter VC of the slave supply SS' of FIG. 3. The output of the slave supply SS' on line G passes a current $I_{NS}$ into one end of the fixed winding $N_S$, the point Y at the other end of this winding being driven to ground potential by the amplifier A4, as before. Also unchanged from FIG. 2 are the resistor Rd and the output terminal Ed which continues to provide the third signal which, in this instance, is a voltage relative to ground potential that represents the desired analog output corresponding to the digital input.

FIG. 5A shows an alternative arrangement in which the amplifier A4 is dispensed with, the end of the resistor Rd not connected to the winding $N_S$ being grounded, and the output Ed being the voltage across the resistor Rd. The amplifier A7 is optional.

Alternatively, if an analog current output is required, the resistor Rd can be part of an external circuit that measures the current in the winding $N_S$.

FIG. 5 shows a complex winding $N_X$ consisting of three sections $N_{XI}$, $N_{XJ}$ and $N_{XK}$. To achieve the 26-bit overall winding $N_X$ referred to above in connection with equation (5), these winding sections can conveniently have 13, 8 and 5 groups of turns, i.e. bits, respectively. A master power supply MS, e.g. battery E1, supplies a current $I_X$ into one end of a resistor $R_X$ (this reference letter has been retained, since this resistor has the same location in the circuit as the resistor $R_X$ in FIG. 2, although it is no longer an unknown resistor, the resistance value of which is to be measured). The other end of the resistor $R_X$ is connected through point X to one end of part $N_{XI}$ of the complex winding $N_X$. The amplifiers A1 and A2 and the sensing resistor R of the FIG. 2 circuit remain, the amplifier A1 driving the point X to ground potential and the amplifier A2 generating the second signal on line K. This second signal is supplied to the multiplying digital-to-analog converter MDAC1 of the slave supply SS' and to the resistors R1 and R2 associated with the amplifiers A5 and A6 of the winding sections $N_{XJ}$ and $N_{XK}$, these parts being essentially unchanged from FIG. 3. However, in this instance, i.e. use of the circuit to form a DAC, the third voltage signal at terminal Ed (or the current equivalent) is no longer applied to a microprocessor, no attempt being made to bring such signal to zero. While control of the number of turns on the variable winding $N_X$ is still exercised by the switch controller SC, this number of turns is based on a digital input signal DIS. Alternatively, this digital input can take the form of manual adjustment of the number of turns on the variable winding.

The relationship in the FIG. 5 circuit between the values of Rd and $R_X$ is given by the equations $$I_X = \frac{E1}{R_X} \quad (9)$$

$$I_X N_X = I_{NS} N_S \quad (10)$$
$$Ed = I_{NS} Rd \quad (11)$$

These equations can be solved for Ed, the analog output signal, as $$Ed = \frac{N_X}{N_S} \cdot \frac{Rd}{R_X} \cdot E1 \quad (12)$$

Hence the absolute values of Rd and $R_X$ are unimportant, and the ratio of Rd to $R_X$ can be chosen at will.

The only requirement is that it be known. Hence with E1, $N_S$ and the ratio Rd to $R_X$ all constant and known, the analog output signal Ed is proportional to the digital input (the number of turns on the winding $N_X$). As in FIG. 3, the amplifiers A5, A6 and resistors R1, R2 can be replaced by the second multiplying digital-to-analog converter MDAC2, resistor Rm and auxiliary ratio winding $N_{XD}$, connected to the line K by line H.

Important differences between the new circuit of FIG. 5 and the prior circuit shown in U.S. Pat. No. 4,638,302 are as follows:

(1) In the prior circuit it was essential that the resistances of the resistors R1 and R2 have an exact, predetermined ratio to each other, such ratio being fixed by the number of bits in the second winding section $N_j$. In the example given in the patent, this number of bits was taken as 8, so that the ratio of R2 to R1 had to be equal to $2^8$ or 256. In the new circuit this requirement for a fixed, and in practice comparatively high ratio with respect to R1 is avoided. It is merely necessary to know the ratio of Rd to $R_X$ to calibrate the output, the only restrictions on the values of Rd and $R_X$ being that they must be compatible with the ratings of the amplifiers.

(2) In the prior circuit there are two supplies, e.g. the batteries Er and Es. The new circuit needs only one supply, e.g. the battery E1.

(3) In the prior circuit it is necessary to adjust the resistor Ri to correspond to the various positions of the switches 16, 17, so that its value corresponds at any given time to the number of turns in circuit in the first primary winding section Ni. In the new circuit there is no such need. A reason for this difference resides in the fact that, whereas the prior circuit contained elements that corresponded in function to the lines F (the "first" signal) and G of FIG. 5 and also an output Eo that corresponded to the output Ed (the "third" signal) of FIG. 5, it contained no equivalent to the line K that transmits the "second" signal.

(4) The circuit of FIG. 5 thus shares with the circuit of FIG. 2 the generation of three signals that are absent from both prior resistance bridges and prior DAC's, and which are made use of in the present invention to enhance the performance of the bridge or DAC in which the circuit of the present invention is employed.

What is claimed is:

1. A DC current comparator circuit comprising:
   (a) a current comparator having a pair of ratio windings, one of said windings having a variable number of turns, and modulation means for detecting DC current in the ratio windings and for generating a first DC signal proportional to a DC ampere-turn unbalance between said windings,
   (b) means for connecting a first end of a resistor to a first end of the variable winding,
   (c) master power supply means for applying a potential to the second end of said resistor,
   (d) means for generating a second DC signal proportional to the DC current in the variable winding, and
   (e) slave means having input means connected to receive said first and second DC signals and output means connected to one end of the other of said windings for supplying a DC current to said other winding.

2. A circuit according to claim 1, incorporated in a bridge and further comprising means connected to the other end of said other winding for generating a third signal proportional to the change to the number of turns on the variable winding needed to bring the bridge to balance.

3. A circuit according to claim 2, further comprising bridge means comprising
   (g) a further resistor having a first end connected to said other end of the other winding, said resistors constituting a pair of test resistors, one being a standard resistor and the other an unknown resistor, the resistance of which is to be compared to the resistance of the standard resistor by said bridge means,
   (h) means for maintaining the potential drops across the two resistors equal to each other, including means connecting said master power supply means to the second end of said further resistor,
   (i) said means for generating the third signal including means for detecting any inequality between the current in the other winding and the current in said further resistor whereby said third signal becomes proportional to any unbalance in the bridge means whereby to enable adjustment of the number of turns of the variable winding to bring said unbalance to null and thus ensure that the ratio between said resistances is proportional to the number of turns of the variable winding.

4. A circuit according to claim 1, further comprising means connected to the other end of said other winding for generating a third signal proportional to the number of turns on the variable winding.

5. A circuit according to claim 4, wherein said variable winding is divided into a series of groups of turns with the number of turns in the respective groups having a progressive relationship to one another, the circuit including means controlled by a digital input for selectively connecting together at least some of said groups in order to determine the total number of turns of said variable winding so that said third signal provides an analog output signal corresponding to said digital input signal.

6. A circuit according to claim 5, including at least one additional ratio winding having a variable number of turns connected to receive a current proportional to said second signal.

7. A circuit according to claim 6, wherein each said additional winding is divided into a further series of groups of turns with the number of turns in respective ones of these further groups having a progressive relationship to one another, said means controlled by the digital input being connected to selectively connect together at least some of the further groups in order to determine the total number of turns of the additional winding.

8. A DC bridge for comparing the resistances of a pair of test resistors, one being a standard resistor and the other an unknown resistor, the bridge comprising
   (a) a current comparator having a pair of ratio windings, one of said windings having a variable number of turns, and means for generating a first signal proportional to an ampere-turn unbalance between said windings,
   (b) means for connecting a first end of one of said test resistor to a first end of the variable winding,
   (c) means for connecting a first end of the other of said test resistors to a first end of the other of said windings, (d) master power supply means for applying potentials relative to ground to the second ends of both said test resistors, including means for maintaining said potentials equal to each other, (e) means for driving to ground potential each of said first ends of the windings whereby to maintain the potential drops across the test resistors equal to each other, (f) means for generating a current in the variable winding equal to the current in the test resistor connected to said variable winding, (g) means for generating a second signal proportional to the current in the variable winding, (h) slave means connected to receive said first and second signals for supplying a current to the other of said windings opposite to and substantially equal to the current in the test resistor connected to said other winding, and (i) means for detecting any inequality between the current in the other winding and the current in the test resistor connected to said other winding for generating a third signal proportional to any unbalance in the bridge to enable adjustment of the number of turns of the variable winding to bring said unbalance to null and thus ensure that the value of the ratio between the resistances of the test resistors is equal to the ratio between the number of turns of the respective ratio windings to which such test resistors are connected.

9. A bridge according to claim 8, wherein the means for driving to ground potential the first end of the variable winding and the means for generating the second signal proportional to the current in the variable winding together comprise (j) a first operational amplifier having inputs connected respectively to said first end of the variable winding and to ground, and an output connected through a first resistor to the second end of the variable winding, and (k) a second amplifier having inputs connected across said first resistor and an output furnishing said second signal.

10. A bridge according to claim 8, wherein the means for driving to ground potential the first end of the other winding and the means for generating the third signal together comprise an operational amplifier having inputs connected respectively to said first end of the other winding and to ground and an output connected through a resistor to said first end of the other winding, said output furnishing said third signal.

11. A bridge according to claim 8, wherein the means for maintaining the potentials of the second ends of the test resistors equal to each other comprise either a unity gain amplifier having one input connected to the master power supply means and to one of said second ends and another input and an output connected together and to the other of said second ends whereby to form a 4-terminal measurement bridge, or a direct connection of said second ends to each other and to said master power supply means whereby to form a 3-terminal measurement bridge.

12. A bridge according to claim 8, including means for measuring said second and third signals, and means for adjusting the number of turns of the variable winding to bring the bridge to balance by an amount calculated from such measurements.

13. A bridge according to claim 8, including means for measuring said second and third signals, means for adjusting the number of turns of the variable winding to bring the bridge approximately to balance by an amount calculated from such measurement, and means for modifying the value of the ratio between the resistances of the test resistors by an amount calculated from the degree of, unbalance of the bridge.

14. A bridge according to claim 8, wherein the variable winding is divided into a series of groups of turns, the number of turns in the respective groups having a progressive relationship to one another, for example based on powers of 2 or on a decimal system.

15. A bridge according to claim 14, wherein the current comparator includes at least one further variable ratio winding, each such further ratio winding being connected to receive a current proportional to said second signal, and each such further ratio winding being divided into a series of groups of turns, the number of turns in the respective groups having a progressive relationship to one another, for example, based on powers of 2 or on a decimal system.

16. A bridge according to claim 14, wherein the current comparator includes a further ratio winding having a fixed number of turns, said further ratio winding being connected to receive a current proportional to said second signal.

17. A bridge according to claim 8, wherein the means for generating a second signal comprises a sensing resistor in series with the variable winding, and means for sensing the voltage across said sensing resistor.

18. A digital to analog converter comprising:

(a) a current comparator having a pair of ratio windings, one of said windings having a variable number of turns, and means for generating a first signal proportional to an ampere-turn unbalance between said windings, (b) means for connecting a first end of a resistor to a first end of the variable winding, (c) master power supply means for applying a potential to the second end of said resistor, (d) means for generating a second signal proportional to the current in the variable winding, (e) slave means having input means connected to receive said first and second signals and output means connected to one end of the other of said windings for supplying a current to such other winding, (f) means connected to the other end of said other winding for generating a third signal proportional to the number of turns of the variable winding, and (g) means controlled by a digital input for determining the number of turns of the variable winding whereby the third signal provides an analog output signal corresponding to said digital input.

19. A converter according to claim 18, wherein said variable winding is divided into a series of groups of turns with the number of turns in the respective groups having a progressive relationship to one another, the converter including means controlled by the digital input for selectively connecting together at least some of said groups in order to determine the total number of turns of said variable winding.

20. A converter according to claim 19, including at least one additional ratio winding having a variable number of turns connected to receive a current proportional to said second signal.

21. A circuit according to claim 20, wherein each said additional winding is divided into a further series of groups of turns with the number of turns in respective ones of these further groups having a progressive relationship to one another, said means controlled by the digital input being connected to selectively connect together at least some of the further groups in order to determine the total number of turns of the additional winding.

* * * * *